United States Patent [19]

Chestnut

[11] Patent Number: 4,799,362

[45] Date of Patent: Jan. 24, 1989

[54] MODULAR HOME ICE MAKER TEST APPARATUS

[75] Inventor: Paul B. Chestnut, Daviess County, Ky.

[73] Assignee: Whirlpool Corporation, Benton Harbor, Mich.

[21] Appl. No.: 136,025

[22] Filed: Dec. 21, 1987

[51] Int. Cl.$^4$ .............................................. F25B 49/00
[52] U.S. Cl. ....................................... 62/127; 62/298; 62/353
[58] Field of Search ................. 62/127, 126, 125, 298, 62/353, 344; 165/11.1; 236/94

[56] References Cited

U.S. PATENT DOCUMENTS

| | | | |
|---|---|---|---|
| 2,717,500 | 9/1955 | Ploeger | 62/7 |
| 2,717,501 | 9/1955 | Andersson | 62/7 |
| 2,717,504 | 9/1955 | Knerr | 62/7 |
| 3,276,225 | 10/1966 | Linstromberg | 62/353 |
| 3,736,765 | 6/1973 | O'Dell | 62/125 X |
| 3,890,836 | 6/1975 | McKenzie et al. | 165/11.1 X |
| 4,146,085 | 3/1979 | Wills | 62/127 X |
| 4,573,325 | 3/1986 | Chiu et al. | 62/129 |

Primary Examiner—Harry B. Tanner
Attorney, Agent, or Firm—Wood, Dalton, Phillips, Mason & Rowe

[57] ABSTRACT

A test device arranged to be electrically connected to a plurality of terminals provided in a control mechanism of an ice maker apparatus. The test device includes a plurality of switches and indicator lamps connected to the control mechanism circuit for selective determination of causes of malfunctioning of different electrical components of the ice maker apparatus. The control includes a switch for initiating a cycle of operation of the ice maker apparatus and an indicator lamp for indicating the presence of voltage in the control mechanism circuit. The test device is arranged to permit observation of the rotational position of the control mechanism drive and, more specifically, the rotational position of the cam driven thereby to indicate to the service person the point in the cycle of operation reached by the mechanism.

19 Claims, 2 Drawing Sheets

MODULAR HOME ICE MAKER TEST APPARATUS

BACKGROUND OF THE INVENTION

1. Field of the Invention

This invention relates to ice makers and more specifically to a test apparatus for testing the operating condition of components of ice makers.

2. Description of the Background Art

In one known domestic ice maker construction, the ice maker apparatus includes a control mechanism having a control circuit for effecting automatic cyclical operation of the ice maker apparatus. The ice maker apparatus further includes a plurality of electrical components, such as an electric motor for operating the ice ejecting means of the ice maker apparatus. The motor is further conventionally utilized to drive a cam for controlling switches in a control circuit for effecting the desired cyclical operation of the ice maker apparatus.

The ice maker apparatus further conventionally includes an electrical heater for warming the mold of the ice maker apparatus when it is desired to effect ejection of the ice bodies upon completion of the forming thereof. Still further, the conventional ice maker apparatus includes a water delivery valve having an electric solenoid operator connected in the control circuit for effecting selective delivery of water to the ice maker mold in the cyclical operation of the apparatus.

In the event of malfunctioning of the ice maker apparatus, it is desirable to provide means for effecting facilitated testing of the electrical components of the ice maker apparatus and control circuit to minimize down time and to minimize expense in determining the cause of the malfunctioning.

Conventionally, such testing of the ice maker apparatus and control circuit is effected by a technician having suitable meters and probes. Such technicians are conventionally trained in the operation and testing of the apparatus as substantial skill is required in properly carrying out such activities.

SUMMARY OF THE INVENTION

The present invention comprehends the provision of a test device which, when utilized in conjunction with an ice maker apparatus control, provides facilitated testing of the ice maker apparatus electrical components and control circuit components, permitting the testing of a malfunctioning apparatus to be conducted quickly and by personnel having less training than that previously required.

More specifically, the invention comprehends the provision of such a test device adapted to be electrically connected to the electrical circuit of the ice maker apparatus control mechanism as an incident of plug-in of electrical contacts on the test device with respect to electrical contacts provided in the control mechanism.

The test device includes a plurality of indicators connected to provide an indication of the functioning of the respective electrical components of the ice maker apparatus at different times in the cyclical operation thereof.

The test device further includes a plurality of switches corresponding to the indicators for bypassing the control circuit and effecting direct energization of the electrical components of the ice maker apparatus when desired.

The test device further provides means for exposing the cam of the control mechanism for observation during the testing operation.

The control mechanism of the conventional ice maker apparatus is mounted within an outer housing having a removable front portion. The test device of the present invention is mounted to the control mechanism upon removal of the front portion of the housing. The test device includes an outer housing portion which aligns with the remaining portion of the control mechanism housing for facilitated connection of the electrical connectors of the test device to the electrical connectors of the control mechanism.

In the present invention, the mounting of the test device to the control mechanism is effected by the frictional engagement of the electrical connectors of the test device to the electrical connectors of the control mechanism.

In the illustrated embodiment, the indicator means comprises a plurality of signal lights for indicating the cycle start, motor run, heater on, and valve on operations of the apparatus.

The invention comprehends further the provision in the test device of indicator means for indicating the relative rotative position of the motor drive in the cyclical operation of the apparatus and, more specifically, the rotative disposition of the cam of the control mechanism driven by the motor drive for operating control switches of the control mechanism.

The control means of the apparatus includes a thermostat for effecting initiation of the cyclical operation thereof and the test device includes a manual start switch arranged to bypass the thermostat in effecting initiation of the cyclical operation by the test person.

Because of the simplicity of the testing operation permitted by use of the test device of the present invention, the training of service personnel sufficient to properly service the ice maker apparatuses may be reduced and the time for effecting servicing of malfunctioning ice maker apparatuses may be reduced.

The testing device of the present invention is extremely simple and economical of construction while yet providing the highly desirable advantages discussed above.

BRIEF DESCRIPTION OF THE DRAWINGS

Other features and advantages of the invention will be apparent from the following description taken in connection with the accompanying drawing wherein.

DESCRIPTION OF THE PREFERRED EMBODIMENT

Figure 1:
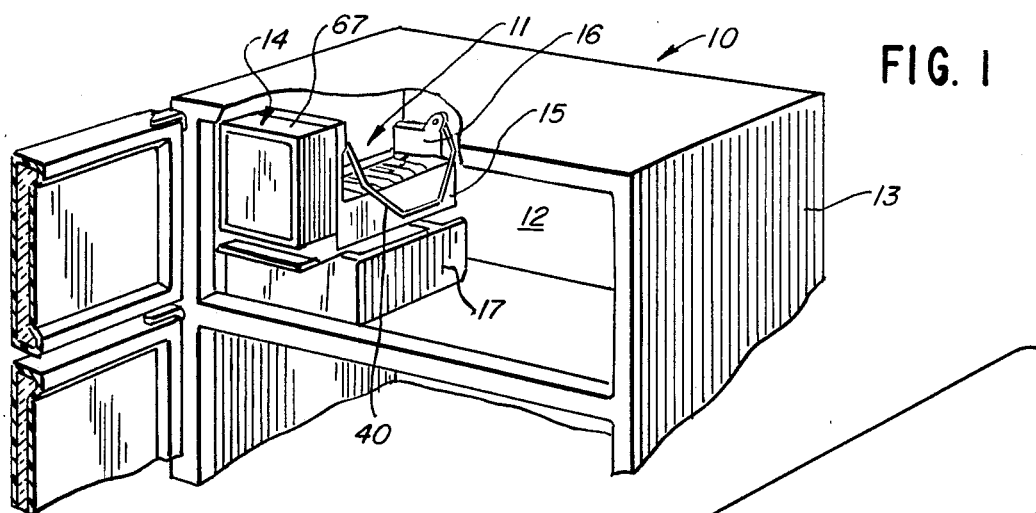
FIG. 1 is a fragmentary perspective view of a refrigeration apparatus having an ice maker apparatus in a freezer compartment thereof.

In the illustrative embodiment of the invention as disclosed in the drawing, a refrigeration apparatus generally designated 10 is provided with an automatic ice maker generally designated 11 mounted in a freezer compartment 12 in an upper portion of the refrigeration apparatus cabinet 13.

The refrigeration apparatus 11 includes a control mechanism generally designated 14 and an upwardly opening mold 15 into which water to be formed into a plurality of ice bodies in mold 15 is delivered through a control valve 16. A storage receptacle, or bin, 17 is disposed subjacent mold 15 for receiving and storing ice bodies harvested from the mold in an ejection operation effected automatically in the cyclical operation of the ice maker apparatus under the control of mechanism 14.

Figure 2:
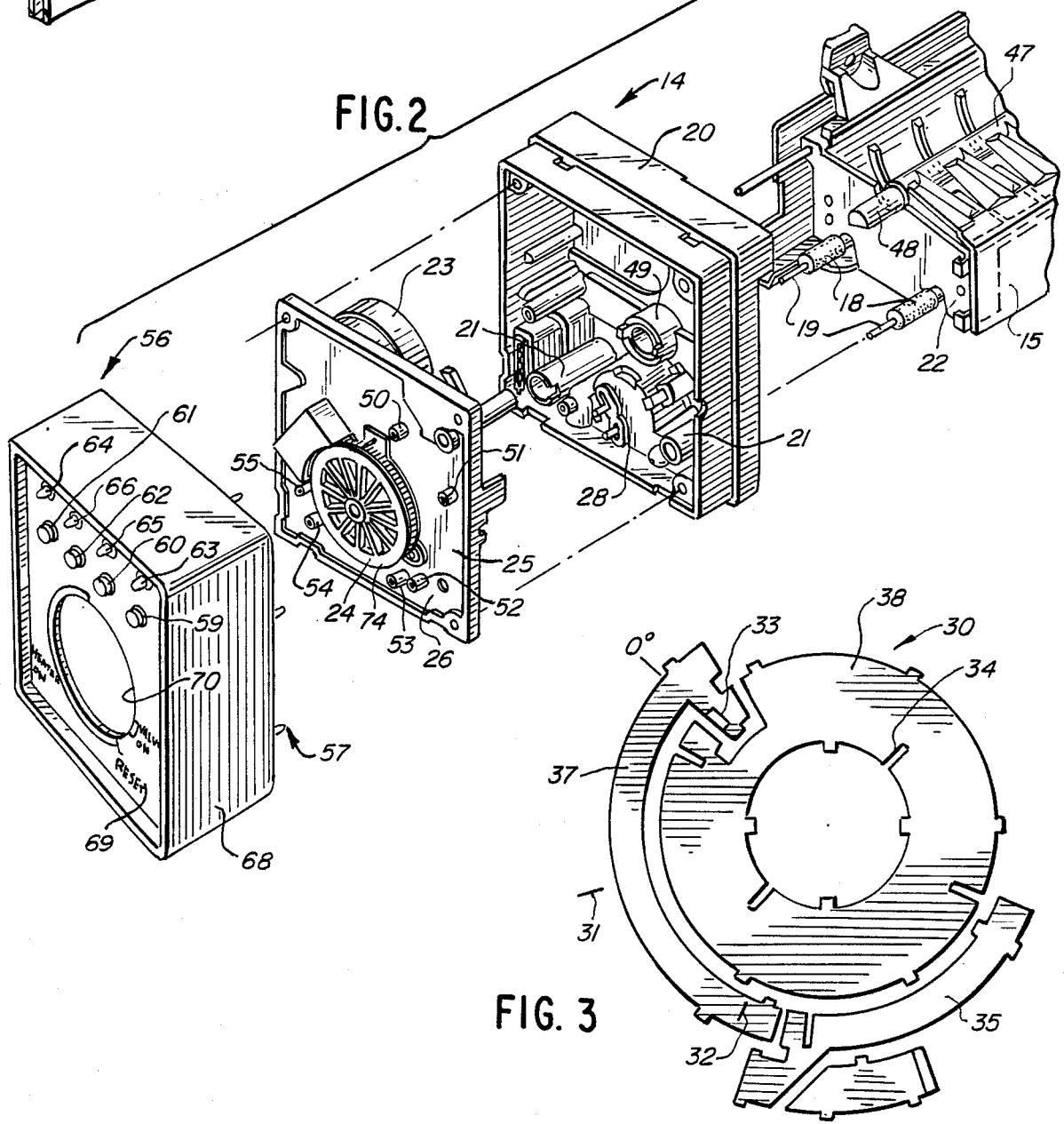
FIG. 2 is a fragmentary exploded perspective view of the ice maker apparatus and test device of the present invention.

To effect release of the formed ice bodies in mold 15 in the harvesting operation, a pair of heaters 18 are provided in the body of the mold, as seen in FIG. 2. The heaters include forwardly projecting end terminals 19.

Control mechanism 14 includes a rear wall portion 20 having a pair of tubular sockets 21 for receiving the mold heater ends when the rear wall portion 20 is mounted to the front end 22 of mold 15.

Both mechanical operation and electrical control of the ice maker is effected by the control mechanism 14. More specifically, as illustrated in FIG. 2, the control mechanism includes a drive motor 23 comprising a timer motor for driving a cam 24 rotatably mounted on the front face 25 of a support wall 26 removably mounted to the control mechanism rear wall portion 20.

Ejection of ice bodies from mold 15 is effected by a fingered ejector blade 47 having a driving connection 48 projecting through a suitable boss 49 in rear wall portion 20 to be suitably driven from the drive motor 23 at the appropriate time in the cyclical operation of the ice maker apparatus by the control mechanism 14.

Figure 4:
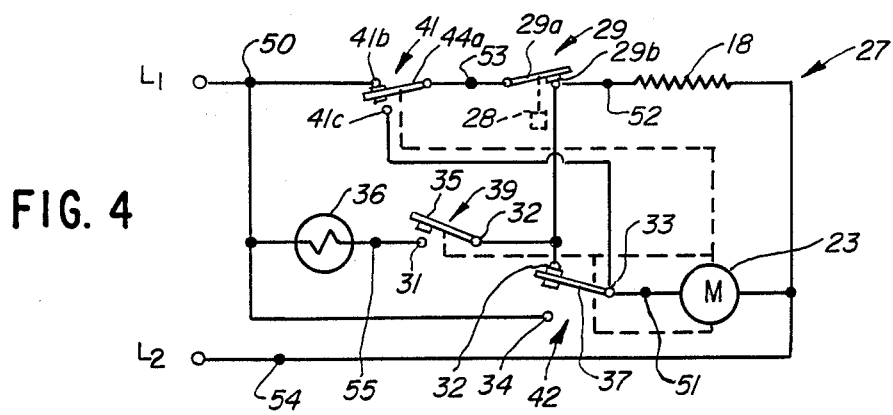
FIG. 4 is a schematic electrical diagram of the electrical circuit of the ice maker apparatus and control mechanism.

The electrical components and circuitry of the ice maker apparatus is illustrated in FIG. 4. Thus, as shown, power to the apparatus is provided from conventional power supply leads L1 and L2, such as conventional 110-volt, 60-cycle power supply leads. A control circuit 27 includes a thermostat 28 which is disposed in heat transfer association with the mold 15 at end 22. In the illustrated embodiment, thermostat 28 comprises a bi-metallic thermostat operatively connected to a switch generally designated 29 having a moving contact 29a and a fixed contact 29b. In the illustrated embodiment, thermostat 28 causes moving contact 29a to close with fixed contact 29b when the temperature sensed by the thermostat drops to 15° F. Suitable hysteresis is provided so as to cause the opening of the switch at a higher temperature, such as 32° F.

Figure 3:
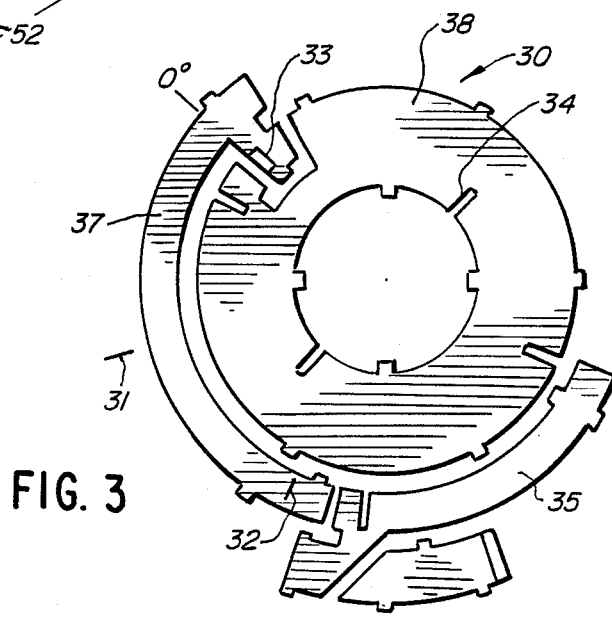
FIG. 3 is a front elevation of the cam of the control mechanism.

A rear surface of cam 24 defines a face cam circuit generally designated 20, as seen in FIG. 3. The face cam circuit is formed of bands of electrically conductive material adhered to the rear face of the cam 24. The 0° home position of the cam is indicated at the upper left-hand portion of FIG. 3. Fixed contacts 31, 32, 33, and 34 comprise electrically conductive brushes mounted to the support wall 26 in fixed axial radial positions relative to the face cam circuit 30. An arcuate contact strip 35 defines a water valve switch 39 for energizing the solenoid 36 of the water-fill valve 16 when the arcuate contact bridges the fixed contacts 31 and 32. A second arcuate contact 37 of the face cam circuit defines a holding switch 42 in association with the fixed contacts 32 and 33.

A third moving arcuate contact 38 comprises a second portion of the holding switch 42 in association with the fixed contacts 33 and 34.

A ice bin level sensing arm 40 is operated by the control mechanism to sense the level of ice bodies in the collecting bin 17. A shutoff switch 41 has a moving contact 41a connected to the moving contact 29a of switch 29, a first fixed contact 41b connected to the power supply lead L1, and a second fixed contact 41c connected to the contact 33 of switch 42.

As further shown in FIG. 4, the heater 18 is connected between fixed contact 29b of switch 29 and power supply lead L2. Fixed contact 29b is further connected to contact 32 defining a fixed contact of switch 42 and switch 39. The water valve solenoid 36 is connected between power supply lead L1 and fixed contact 31 of switch 39, as shown.

Figures 6, 7:
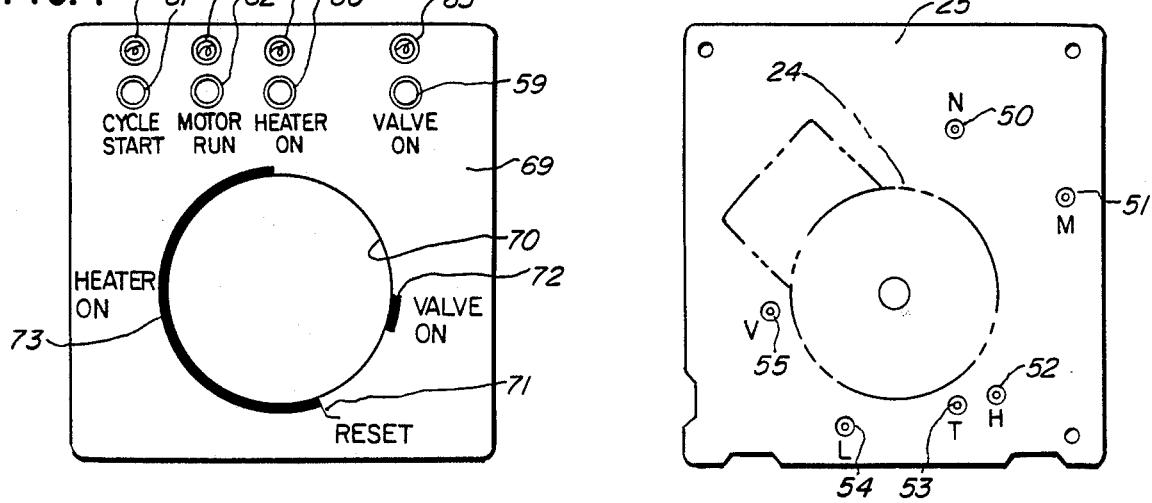
FIG. 6 is a schematic representation of the interconnected electrical connectors of the test device and control mechanism for use in carrying out the testing operation by means of the test device of the present invention.
FIG. 7 is a front elevation of the test device illustrating in greater detail the test switches and indicator means thereof.

The invention further comprehends the provision of electrical contact terminals carried on the front face 25 of the support wall 26. Thus, as seen in FIG. 6, the support wall carries female connector terminals 50, 51, 52, 53, 54, and 55. The connection of these terminals in control circuit 27 is illustrated in FIG. 4.

Figure 5:
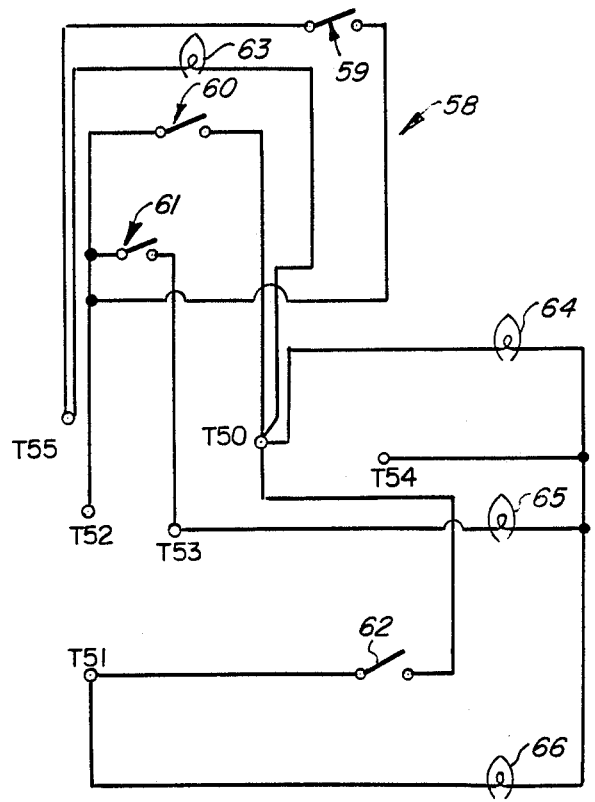
FIG. 5 is a wiring diagram illustrating the interconnections of the ice maker apparatus and control mechanism.

As indicated briefly above, the invention comprehends the provision of a test device generally designated 56. The test device is provided with a plurality 57 of rearwardly projecting contact terminals aligned with the contact terminals carried on wall 25. In the illustrated embodiment, the terminals 57 comprise male terminals and the terminals 50–55 comprise female terminals. Terminals 56 include terminals T50, T51, T52, T53, T54, and T55, as shown in FIG. 5. The terminals are connected in a test circuit generally designated 58, which further includes a plurality of manually operable single-pole switches 59, 60, 61, and 62 and a corresponding plurality of indicator lamps 63, 64, 65, and 66, as shown in FIG. 5. As shown, switch 59 is connected between terminals T55 and T54, switch 60 is connected between terminals T52 and T50, switch 61 is connected between terminals T52, and T53, and switch 62 is connected between terminals T51, and T50. Lamp 63 is connected between terminals T55 and T50, lamp 64 is connected between terminals T50 and T54, lamp 65 is connected between terminals T53 and T54, and lamp 66 is connected between terminals T51 and T54.

Control mechanism 14 includes a removable front wall 67 which, when removed, exposes the support wall 25 and female terminals 50–55 carried thereon. Test device 56 is mounted to the control mechanism solely by moving the control device rearwardly from the position shown in FIG. 2 to engage the male terminals 57 with the female terminals carried by the support wall of the control mechanism. As seen in FIG. 2, the test device includes an outer housing portion 68 which is complementary to the housing portion 20 of control mechanism 14 to serve as a guide in effecting the interconnection between the male terminal 57 and females terminals 50–55. Thus, more specifically, terminal T50 shown in FIG. 5 is electrically connected to terminal 50 shown in FIG. 6, terminal T51 is connected to terminal 51, terminal T52 is connected to terminal 52, terminal T53 is connected to terminal 53, terminal T54 is connected to terminal 54, and terminal T55 is connected to terminal 55, whereby the terminals of the test device are electrically connected to the respective terminals of the control mechanism.

Thus, switch 61 is connected across switch 41 by virtue of the connection of terminal T52 shown in FIG. 5 to terminal 52 shown in FIG. 4, and terminal T53 shown in FIG. 5 to terminal 53 shown in FIG. 4.

Resultingly, switches 59, 60, 61 and 62 are connected in parallel with switches 39, 29, 41, and 42 to permit selective operation of the different components of the ice maker apparatus, as desired.

As further illustrated in FIG. 7, the switches and indicator lamps of test device 56 are mounted on a front wall 69 of the housing 56. The front wall defines an opening 70, which is aligned with cam 24 so as to permit the test person to observe the rotational position of cam 24 at all times during the testing operation. A reset indication 71, a valve on indication 72, and a heater on indication 73 on provided on the wall 69 adjacent the opening 70 for indicating the control functioning with respect to the rotational position of the cam 24 observable therethrough.

The use of test device 56 is extremely simple. The test person personally removes the front cover 67 of the control mechanism and plugs the test device male terminals 57 into the female terminals of the control mechanism. Power is supplied to the test device from the power supply leads L1 and L2 of the control circuit 27. The presence of the power is indicated by the illumination of lamp 64.

The test person then presses switch 61 to initiate a cycle of operation of the ice maker. A suitable indicator mark 74 may be provided on the cam 24 for cooperation with the indicators 71, 72, and 73 in identifying the normal operating condition of the ice maker apparatus as a function of the rotation of the cam following the initiation of the operating cycle.

Assuming that the apparatus is properly functioning, the indicator lights 66, 65 and 63 will be illuminated at the appropriate time in the operation of the ice maker.

However, if a malfunction takes place, the test person may bypass the control circuitry and directly apply voltage from the power supply leads to the electrical component of interest by manually depressing the appropriate switch 59, 60, or 62.

Thus, for example, if the water valve does not operate to deliver water to the ice maker mold, the test person may press the switch 59 and observe if the valve then functions. If the valve functions so as to deliver water to the mold, then the test person knows that a problem exists in the contact within the control module that should supply voltage to the valve. If the valve does not operate when voltage is applied directly thereto by closing of the switch 59, the test person knows that there is a malfunctioning in the valve itself or in the cabinet wiring to the valve.

Malfunctioning of shutoff switch 41 may be checked by manipulating the bin level sensing arm 40 to the upper "off" position and then attempting to start a cycle of operation with the start cycle switch 61. The ice maker motor 23 should not operate, notwithstanding the closing of switch 61, until the shutoff arm is lowered.

Thermostat switch 29 may be checked by allowing the ice maker to stabilize at a temperature below 15° F. as by maintaining the shutoff arm 40 in an upper position for at least an hour in a cold freezer compartment. After the ice maker has stabilized at a low temperature that is low enough to cause the thermostat 28 to close the thermostat switch 29, the switch may be checked with a voltmeter connected across terminals 52 and 53. Alternatively, the test device 56 may be utilized to check the thermostat switch by lowering the shutoff arm and observing whether or not the cam 24 rotates and the heater light 65 is illuminated. If the cam does not rotate and the heater light does not become illuminated, the service person may bypass the thermostat using the start switch 61 to simulate closing of the thermostat. If the cam now turns and the heater light is illuminated, the thermostat may be presumed to be bad and appropriate servicing action taken.

Thus, the invention comprehends the provision of a test device which is provided with a plurality of test terminals arranged to be connected concurrently to a corresponding plurality of terminals provided in the control mechanism circuit. The test device includes a plurality of switches including a switch for initiating cyclical operation of the ice maker apparatus and switches for bypassing electrical components of the apparatus in the event a malfunctioning is found to exist. By utilizing the selectively operable switches, rapid determination of the causes of malfunctioning of the different components of the ice maker apparatus may be effected by service personnel of medium skill.

The test device may be readily removed from association with the control mechanism, and the front cover of the control mechanism replaced upon correction of the malfunctioning.

The foregoing disclosure of specific embodiments is illustrative of the broad inventive concepts comprehended by the invention.

I claim:

1. In an ice maker apparatus including a control mechanism having a control circuit for effecting automatic cyclical operation of the ice maker apparatus, said ice maker apparatus further including a plurality of electrical components, test means for testing the condition of the electrical components comprising:

a test circuit having electrical connectors arranged to have electrical connection to said electrical components as an incident of the test circuit being removably associated with the control mechanism while maintaining the arrangement of the control circuit to permit operation of the apparatus by the control mechanism;

switches in the test circuit for selective operation by a user; and indicator means in the test circuit for indicating a condition of said electrical components, said indicator means being connected to said electrical connectors in said test circuit for selective indication of the operability of said electrical components when said electrical connectors are electrically connected thereto and said switches being operable to selectively energize said electrical components in the event a malfunction thereof is indicated by said indicator means.

2. The ice maker apparatus of claim 1 wherein said test circuit includes means for initiation of a cycle of operation of the ice maker apparatus as a result of operation of one of said switches in said test circuit.

3. The ice maker apparatus of claim 1 wherein said test circuit includes means for initiation of a cycle of operation of the ice maker apparatus as a result of operation of one of said switches in said test circuit, and identification means are provided adjacent said indicator means for identifying to the user the different actions of the ice maker apparatus as they take place in the cycle of operation of the ice maker apparatus upon initiation of the cycle of operation.

4. The ice maker apparatus of claim 1 wherein means are provided in said test circuit for bypassing the control circuit and for selectively directly energizing said electrical components from said test circuit.

5. The ice maker apparatus of claim 1 wherein said control mechanism includes an outer housing portion and said test means includes an outer housing portion arranged to be aligned with said control mechanism outer housing portion when said test circuit connectors are connected to said electrical components.

6. The ice maker apparatus of claim 1 wherein said switches are selectively connectible to said electrical components for providing electrical energy directly to said components.

7. The ice maker apparatus of claim 1 wherein said indicator means comprise visual indicator means.

8. In an ice maker apparatus including a control mechanism having a control circuit, for effecting automatic operation of the ice maker apparatus, said ice maker apparatus further including a plurality of electrical components, the improvement comprising:
first connectors electrically connected to said control circuit; and
a test device having a test circuit provided with second connectors arranged to have concurrent electrical connection to said first connectors while maintaining the arrangement of the control circuit to permit operation of the apparatus by the control mechanism, a plurality of switches connected in the test circuit for selective operation by a user for bypassing said control circuit and selectively energizing said electrical components directly, and indicator means connected in the test circuit for selectively indicating the operating condition of said electrical components.

9. The ice maker apparatus of claim 8 wherein said indicator means comprises a plurality of indicators associated one each with said switches.

10. The ice maker apparatus of claim 8 wherein said control mechanism includes a rotatable cam and said test device includes means for exposing said cam for observation with said test device connected to said first connectors.

11. In an ice maker apparatus including a control mechanism having a control circuit for effecting automatic operation of the ice maker apparatus, said ice maker apparatus further including a plurality of electrical components, the improvement comprising:
means associated with the control mechanism defining first connectors electrically connected to said electrical components in said control circuit; and
a test device having a test circuit provided with second connectors arranged to have electrical connection to said first connectors as an incident of the test device being associated with the control mechanism while maintaining the arrangement of the control circuit to permit operation of the apparatus by the control mechanism, switch means in the test circuit for selective operation by a user, and indicator means in the test circuit for indicating a condition of said electrical components, said switch means and indicator means being connected to said second connectors in said test circuit for selective indication of the operability of said electrical components when said first and second connectors are electrically connected.

12. The ice maker apparatus of claim 11 wherein said connectors comprise complementary pin and socket connectors.

13. The ice maker apparatus of claim 11 wherein said indicator means comprises means for providing a visual signal.

14. The ice maker apparatus of claim 11 wherein said control mechanism includes an outer housing having a removable cover, said first connectors being exposed as a result of removal of said cover from said housing.

15. The ice maker apparatus of claim 11 wherein said first and second connectors comprise cooperating means for retaining the test device mounted to said control mechanism during said selective indication of said operability of the electrical components.

16. The ice maker apparatus of claim 11 wherein said switch means comprise manually operable switches corresponding one each to a corresponding indicator means.

17. The ice maker apparatus of claim 11 wherein said indicator means includes means for indicating the provision of electrical power to the control mechanism.

18. The ice maker apparatus of claim 11 wherein said indicator means includes means for indicating the nonfunctioning of any of a plurality of said electrical components.

19. The ice maker apparatus of claim 11 wherein said switch means is connected in said test circuit to provide electrical power directly to the electrical components from the power source to which the ice maker is connected.

* * * * *

UNITED STATES PATENT OFFICE
CERTIFICATE OF CORRECTION

Patent No. 4,799,362              Dated January 24, 1989

Inventor(s)   Paul B. Chesnut

It is certified that error appears in the above-identified patent and that said Letters Patent is hereby corrected as shown below:

On the title page:

On the face of the patent, Item [75], "Paul B. Chestnut, Daviess County, Ky." should read --Paul B. Chesnut, Daviess County, Ky.--

Signed and Sealed this

Eighth Day of May, 1990

Attest:

HARRY F. MANBECK, JR.

*Attesting Officer*    *Commissioner of Patents and Trademarks*